United States Patent [19]

Duncan, Jr.

[11] Patent Number: 4,851,614

[45] Date of Patent: Jul. 25, 1989

[54] NON-OCCLUDING MOUNTING HOLE WITH SOLDER PAD FOR PRINTED CIRCUIT BOARDS

[75] Inventor: Wayne P. Duncan, Jr., Houston, Tex.

[73] Assignee: Compaq Computer Corporation, Houston, Tex.

[21] Appl. No.: 238,983

[22] Filed: Aug. 24, 1988

Related U.S. Application Data

[63] Continuation of Ser. No. 53,332, May 22, 1987, abandoned.

[51] Int. Cl.$^4$ ............................ H05K 1/00; H05K 3/34
[52] U.S. Cl. ..................................... 174/68.5; 29/843; 29/854
[58] Field of Search .......................... 174/68.5; 427/97; 29/842, 843, 854

[56] References Cited

U.S. PATENT DOCUMENTS

| | | | |
|---|---|---|---|
| 3,567,844 | 3/1971 | Kremar | 174/68.5 |
| 3,865,298 | 2/1975 | Allen et al. | 219/302 X |
| 3,883,682 | 5/1975 | Cagle et al. | 174/68.5 |
| 4,438,560 | 3/1984 | Kisters | 174/68.5 X |
| 4,524,239 | 6/1985 | Rouge | 174/68.5 |
| 4,638,116 | 1/1987 | Gumb | 174/68.5 |

FOREIGN PATENT DOCUMENTS

| | | | |
|---|---|---|---|
| 2008302 | 9/1971 | Fed. Rep. of Germany | 174/68.5 |
| 2837318 | 3/1980 | Fed. Rep. of Germany | 174/68.5 |

OTHER PUBLICATIONS

Glasson, J. M. et al., Programmable Through-Hole Connection; Western Electric Technical Digest No. 20; Oct. 1970, p. 33.

Donald A. Elliott, "Hot Air Leveling of Printed Wiring Boards", Presented at Nepcon-East, Philadelphia, May 17-19, 1977.

Primary Examiner—Morris H. Nimmo
Attorney, Agent, or Firm—Christopher D. Keirs

[57] ABSTRACT

A novel solder pad configuration for printed circuit boards is disclosed which is resistant to solder occlusion upon wave soldering. On the solder side of the circuit board the solder pad is substantially C-shaped and partially surrounds a non-plated through-hole. Via holes provide electrical connection between the pad on the solder side of the board and the corresponding pad on the component side of the circuit boards. The invention is particularly applicable to the chassis ground mounting holes of PCB's.

7 Claims, 3 Drawing Sheets

U.S. Patent    Jul. 25, 1989    Sheet 1 of 3    4,851,614
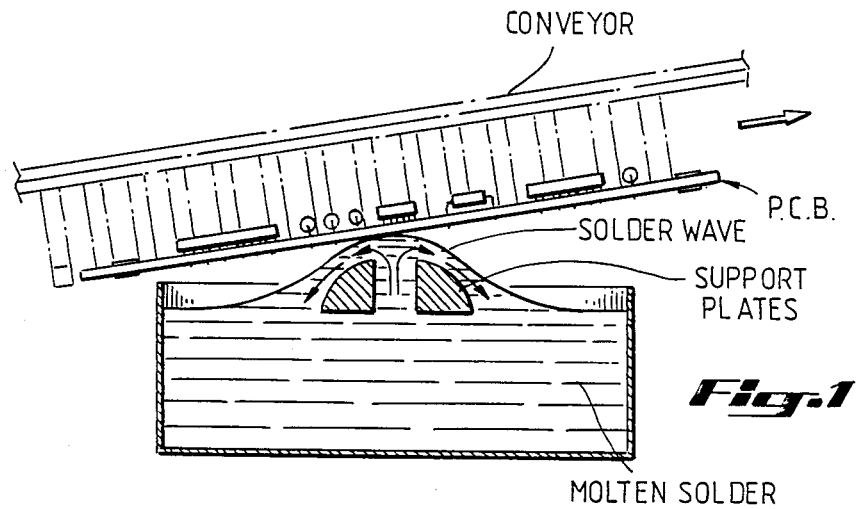
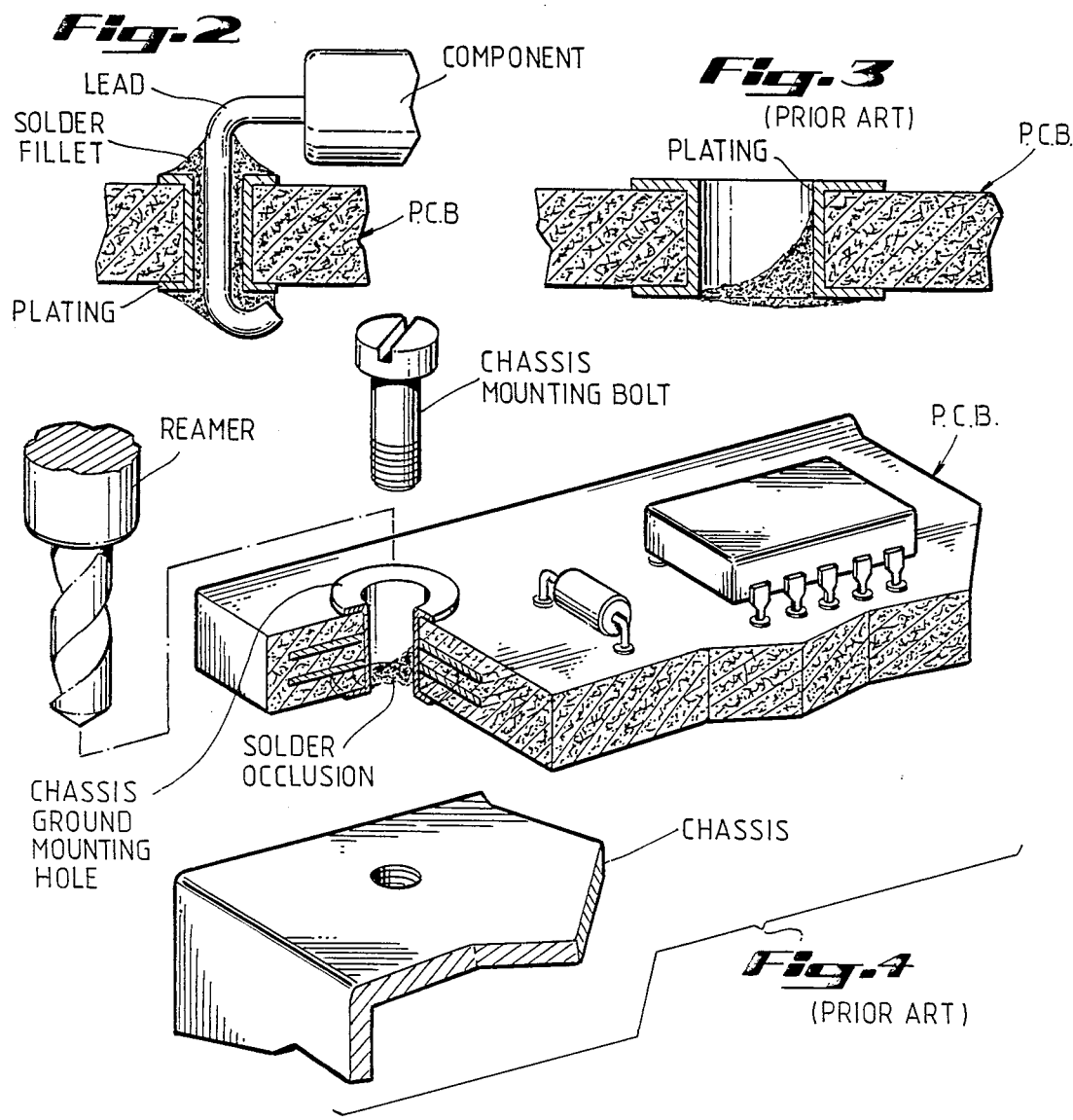

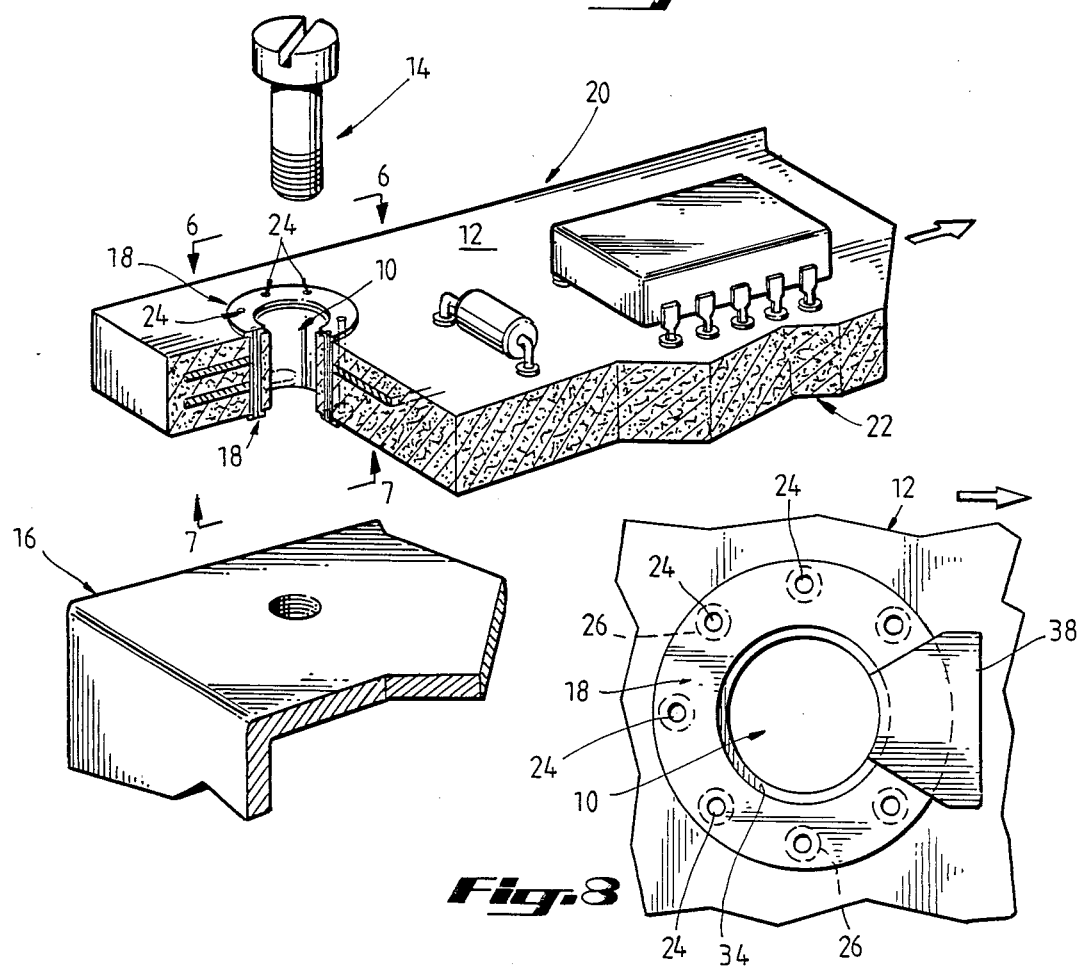
Fig. 5
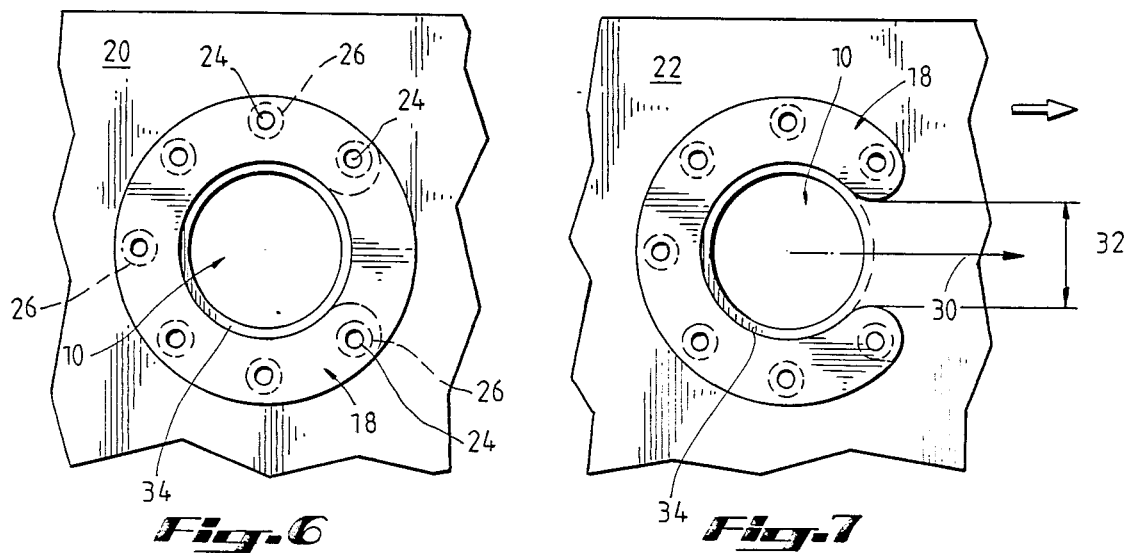
Fig. 8
Fig. 6
Fig. 7

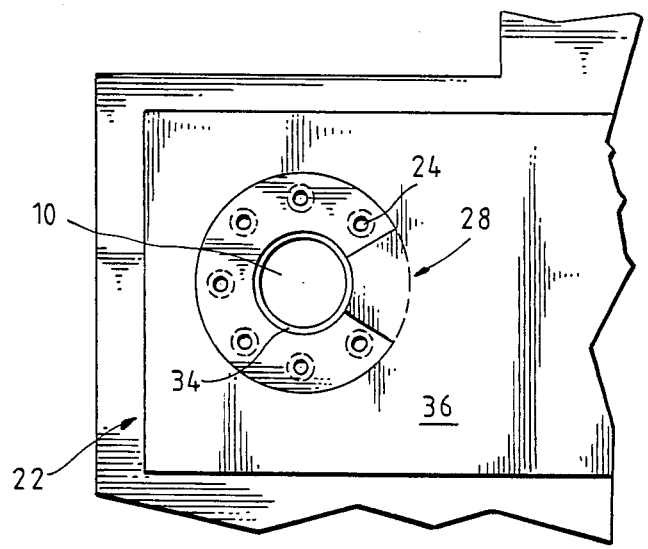
Fig. 8A
Fig. 9
(PRIOR ART)
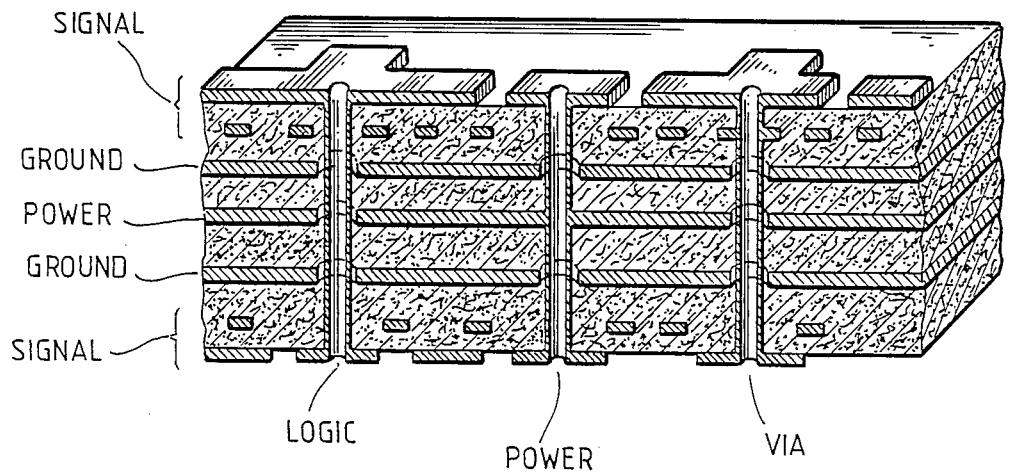

NON-OCCLUDING MOUNTING HOLE WITH SOLDER PAD FOR PRINTED CIRCUIT BOARDS

This is a continuation of co-pending application Ser. No. 053,332 filed on May 22, 1987, now abandoned.

BACKGROUND OF THE INVENTION

1. Field of the Invention

This invention relates to printed circuit boards (PCB's). More particularly, it relates to printed circuit boards having electronic components the leads of which are soldered to the PCB using a wave soldering process.

2. Description of the Problem and the Related Art

Printed circuit boards are most commonly laminated of glass-filled epoxy insulating layers and layers of etched copper conductors. The simplest interconnection structure consists of a single layer of insulation made of a glass-filled epoxy and a single layer of copper conductors. More complex structures consist of numerous layers of conductors and insulators which are divided into power distribution layers, signal layers, and ground plane layers. Signal layers are grouped in pairs which carry electrical information in orthogonal directions (x, y, pairs) and are located adjacent to ground layers. This provides a uniform impedance for the electrical signals and prevents electrical coupling of signals among adjacent conductors. A typical, multilayer printed circuit board with signal layers and ground and power layers is shown in cross section in FIG. 9.

In integrated structures such as those associated with semiconductor circuits (also magnetic bubble circuits and Josephson circuitry) commonly used in digital computers, the first level of packaging consists of a number of switching circuits fabricated on a single part called a chip. The chip is mounted in a structure called a module, which provides environmental protection for the chip and permits electrical interconnection to be made to the next level of package. Modules are normally provided in standard configurations to allow for the design of general-purpose manufacturing equipment and higher-level packages.

Signal wires (traces) on the printed circuit board carry signals between modules and between modules and input/output connections to the circuit board. On computer circuit boards the terminals that carry the logic signals to the modules and to the input/output terminals are called logic service terminals (LST's), those that supply power to the various modules are called power service terminals (PST's), and interconnections between wiring layers in the board are called vias or via service terminals (VST's). FIG. 9 shows the cross section of a typical multilayer circuit board having VST, LST, and PST connections between solder pads on the exterior of the circuit board and traces in internal layers of the board.

Vias may be "blind" holes which are open to one surface of the circuit board but do not extend to the opposite surface; they may be "buried" holes which connect only internal layers of the board and do not extend to either surface of the printed circuit board; or they may be plated through-holes which extend the full thickness of the board and open to solder pads on both surfaces of the board. Like any other relatively small, plated through-hole, a via hole which extends the full thickness of a PCB will most commonly fill with solder due to capillary action when the PCB is subjected to wave soldering.

If two clean metal surfaces are held together and dipped into molten solder, the solder will wet the metal and climb up to fill the gaps between the adjacent surfaces. This phenomenon is the result of capillary action. If the metal surfaces are not clean, the solder cannot wet the surfaces to be soldered, and the solder will not fill the joint. When a properly fluxed PCB having a plated through-hole is passed over a solder wave, the hole fills with solder and produces a fillet on the upper surface (component side) of the circuit board as illustrated in FIG. 2. It is not the pressure of the solder wave that forces solder up into the holes, but rather capillary action.

FIG. 1 depicts a typical wave soldering process for printed circuit boards. Molten solder is pumped up and over support plates to form a wave. A printed circuit board carried on a conveyor is passed over the solder wave at an angle such that the solder side (conductor side) of the board contacts the leading edge of the solder wave. Component leads are soldered to the solder pads on the board and plated through-holes such as via holes fill with solder.

It is not, however, always desirable to fill all holes in a PCB during the wave soldering process. Often PCB's are equipped with mounting holes and/or chassis ground holes which need to remain unobstructed in order to permit the subsequent insertion of mounting hardware such as bolts or screws or the attachment of grounding connectors. Most commonly, mounting holes and chassis ground holes on a PCB are one in the same. These holes are usually relatively large compared to VST's, PST's, and via holes. In order to provide electrical grounding contact to both sides of the PCB, such holes are usually plated through-holes.

FIG. 3 illustrates the common fate of such chassis ground mounting holes when a PCB is wave soldered. Solder partially (or even completely) occludes the hole and, by virtue of its being a plated through-hole, wicks up into the hole.

FIG. 4 illustrates the steps involved in mounting a PCB to a chassis by means of a bolt designed to be passed through a plated through-hole when such hole has become partially or completely occluded with solder. Solder must be reamed from the hole before the mounting hardware can be inserted. Grounding electrical contact is established from the chassis to the circuit board when the mounting bolt is tightened.

In the past it has been necessary to subsequently remove the solder which obstructs such holes by using a reamer (as shown in FIG. 4) or to reheat the solder and remove it in the molten state using a solder sucker or wick. Alternatively, one could apply a removable solder mask to the hole prior to wave soldering. One such removable solder mask is No. 2680 Aqua Strip Mask produced by Kenco Industries, Inc.

There are numerous disadvantages to the above-mentioned methods. All are labor-intensive and usually necessitate the addition of manual labor in an otherwise highly automated process. The reaming method is generally not effective in removing solder from the solder pad surrounding the mounting hole and thus the surface which contacts the head of the mounting bolt or contacts the stud or spacer on the chassis which is used to support the PCB is frequently uneven and thus an uneven strain can be placed on the board when the mounting bolt is tightened. This often results in delamination of the PCB in the region of the mounting hole.

The use of a solder mask also poses problems. The mounting holes of PCB's are often located at or near the periphery of the board. Most commonly, automated equipment for inserting components, wave soldering, and conveying PCB's throughout a manufacturing facility is designed to grasp or otherwise contact the circuit board on its edges. Thus, such equipment often becomes fouled with the solder mask material inasmuch as the solder mask must usually be applied right up to the edge of the board.

The present invention eliminates these problems.

SUMMARY OF THE INVENTION

The invention herein disclosed is a novel configuration of the solder pad surrounding a chassis ground mounting hole on a printed circuit board. The specially configured solder pad is equipped with via holes to provide both electrical contact with other layers of the circuit board (particularly the opposite external face of the board) and to provide mechanical strength.

The pad on the solder side of the printed circuit board is substantially C-shaped with the open portion oriented such that it is the first portion contacted by the solder when the board is wave soldered.

The mounting hole itself is not a plated through-hole.

BRIEF DESCRIPTION OF THE DRAWINGS

FIG. 1 depicts a printed circuit board undergoing wave soldering.

FIG. 2 is a cross sectional view of an axial lead component soldered in a plated through-hole of a printed circuit board.

FIG. 3 shows in cross section the problem of solder occlusion of a chassis ground mounting hole which occlusion obtains in circuit boards of the prior art upon wave soldering.

FIG. 4 is a partially sectioned, exploded view of a printed circuit board, chassis, and PCB mounting bolt. The drawing illustrates the steps involved in mounting a PCB to a chassis by means of a bolt passing through a chassis ground mounting hole of the prior art in the PCB. Also shown in the drawing is a reaming tool for cleaning solder from the mounting hole prior to insertion of the bolt.

FIG. 5 is a partially sectioned, exploded view of a printed circuit board embodying the present invention together with a chassis and mounting bolt for securing the PCB to the chassis.

FIG. 6 is a top (component side) plan view of a chassis ground mounting hole in a printed circuit board equipped with an embodiment of the invention.

FIG. 7 is a bottom (solder side) plan view of a chassis ground mounting hole in a printed circuit board equipped with an embodiment of the invention.

FIGS. 8 and 8A are bottom (solder side) plan views of a chassis ground mounting hole in a printed circuit board equipped with an alternative embodiments of the invention.

FIG. 9 is a cross sectional view of a typical multilayer printed circuit board.

DETAILED DESCRIPTION

Reference is made to the embodiment of the invention shown in FIGS. 5-7. The invention is there depicted as applied to a chassis ground mounting hole 10 of a printed circuit board 12. The term "chassis ground mounting hole" as used herein means a hole through the circuit board of sufficient diameter to permit the insertion of the shank portion a mounting bolt 14. The diameter of the hole should be smaller than the diameter of the head of the bolt so that the bolt, when tightened to a circuit board support structure 16 on the opposite side of the board, secures the board to the support structure. For printed circuit boards used in personal computers, such mounting holes are commonly about 0.156 inch in diameter. However, this invention is applicable to circuit board holes having a wide range of diameters and having functions other than mounting or chassis ground connection.

A "chassis ground mounting hole" is typically surrounded on both sides of the board by pads of exposed conductive material 18 plated onto the external surfaces of the circuit board. In the circuit boards of the prior art, these pads completely surrounded the mounting hole and were most commonly either substantially O-shaped or square. The pads were electrically connected by means of traces on the PCB to the chassis ground of the circuit. The mounting structure used to support the PCB was also chassis ground. Thus, when the board was secured to the conductive mounting structure (or "chassis") a ground was established to the board by reason of the contact of the exposed conductive pads with the chassis. Most preferably, the mounting bolt was also of conductive material so that it too would serve as an electrical path to ground and further electrically connect the conductive pads 18 surrounding the mounting hole to the chassis.

In the circuit boards of the prior art the conductive pad surrounding the mounting hole on the top side ("component side") 20 of the PCB was electrically connected to the pad on the bottom side ("solder side" or "conductor side") 22 of the board by virtue of the mounting hole being a plated through-hole. As noted above, a typical chassis ground mounting hole of the prior art is shown in FIG. 4.

It has been discovered that if the configuration of the conductive pad on the solder side of the circuit board is modified in accordance with the teachings of this disclosure and the mounting hole is not a plated through-hole, the resulting chassis ground mounting hole will not become occluded with solder when the PCB is wave soldered.

The absence of plating in the interior of the through-hole is compensated for by the inclusion of a plurality of via holes 24 which electrically connect the pads on opposite sides of the PCB. The via holes 24 are relatively small plated through-holes which fill with solder when the PCB is wave soldered. Most preferably, the number and size of the via holes is selected such that after they are filled with solder they provide at least the same electrical conductivity from the upper to the lower pad that would obtain if the mounting hole were a conventional plated through-hole.

By way of example, it has been found that if the pad surrounding a 0.156-inch diameter mounting hole is provided with seven 0.036-inch diameter via holes, more than adequate conductivity is obtained to establish a good chassis ground connection when the PCB is mounted.

After the PCB has been soldered and the via holes 24 filled, they provide additional mechanical strength to the board in the region around the mounting hole. A solderfilled via hole is essentially a column of solder surrounded by a tube of copper 26 which extends from one side of the circuit board to the other. As such, they tend to resist crushing of the PCB when the mounting bolt is tightened and thereby reduce the possibility of delamination of the board.

The via holes 24 may be fabricated by any of the conventional methods for providing plated through-holes in a PCB. Suitable methods include a variety of electroless plating processes. For example, in the subtractive process, copper foil (31 mg/cm$^2$ or 1 oz/ft$^2$) is laminated to both sides of a flat board. Through-holes including via holes are punched or drilled. The board is cleaned, catalyzed, and placed in a flash electroless copper bath. A thin conductive layer of copper deposits on the entire board, including the non-conductive holes. The board is electrolytically plated to give 25-micron copper deposits in the through-holes. Further processing of the PCB includes positive masking followed by etching away all unwanted copper to leave the desired circuit. Semiadditive and additive processing are suitable alternative methods well known in the art.

Drilling or punching the non-plated through-holes which function as the mounting holes for the PCB can be delayed until after the electroless plating process so as to avoid plating the interior portions of such holes.

FIG. 7 shows a preferred configuration for the conductive material 18 (the "solder pad") which surrounds the chassis ground mounting hole 10 on the solder side 22 of the circuit board 12. The pad is substantially C-shaped with the gap or opening 28 in the pad 18 oriented such that it is contacted by the solder wave prior to the solder contacting the conductive material. Stated another way, a line 30 drawn from the center of the mounting hole 10 and extending through the middle of the gap 28 in the conductive material comprising the solder pad 18 would lie parallel to the direction of travel of the PCB over a solder wave. Moreover, such a line would extend toward that edge of the PCB which first contacts the solder in the wave soldering machine. The intended direction of travel of the PCB through the solder wave is indicated by the arrows in the drawing figures.

The size 32 of the gap 28 may be varied over a significant range. One important factor in selecting the gap size is the diameter of the mounting hole 10. Generally, the smaller the hole, the larger the gap that is required to avoid solder occlusion. Most preferably, the gap will be the minimum needed to prevent solder occlusion of the hole. This provides the maximum contact area between the pad 18 and the chassis 16 or mounting bolt 14 and hence provides the best electrical connection.

As shown in the figures, the pads of conductive material surrounding the mounting hole on both sides of the board are most preferably displaced slightly from the edge of the hole. For example, an unplated gap 34 of about 0.015 inch is preferably provided around the circumference of the hole.

FIG. 8 shows an alternative embodiment of the invention. In this embodiment the conductive material 18 completely surrounds the mounting hole 10 on the conductor side 22 of the PCB 12. However, non-removable solder mask 36 covers the portion of the solder pad corresponding to the gap 28 in the embodiment illustrated in FIGS. 5–7. This is the type of solder mask commonly used on the conductor side of PCB's to mask off the traces which are not to receive solder and is to be distinguished from the removable solder mask referred to in the foregoing discussion of the prior art.

In FIG. 8 the solder mask is shown applied only to a small area 38 near the chassis ground mounting hole 10. More typically the solder mask will cover the majority of the conductor side (solder side) 22 of the circuit board 12 as illustrated in FIG. 8A. In this embodiment particularly, the exposed portion of the conductive material 18 surrounding the mounting hole 10 resembles a PAC-MAN video game character. (PAC-MAN is a registered trademark of Bally Midway Manufacturing Company of Franklin Park, Ill.)

The present invention has been particularly set forth above in terms of specific embodiments. It is to be understood that variations upon the invention are now enabled to those skilled in the art by reason of this disclosure, which variations lie within the scope of the present teaching. Accordingly, this invention is to be broadly construed, and is limited only by the scope and spirit of the following claims.

What is claimed is:

1. A laminated printed circuit board comprising:
   a plurality of conductor-containing layers;
   a C-shaped solder pad on an external layer of the circuit board disposed about a first hole through the circuit board;
   a second hole through the circuit board passing through the C-shaped solder pad, said second hole having a plated bore which electrically interconnects the C-shaped solder pad with selected conductors on other layers of the circuit board.

2. A printed circuit board comprising:
   a solder pad surrounding a first hole through the circuit board;
   via holes through the solder pad; and,
   solder mask covering a portion of the solder pad such that the unmasked portion of the solder pad is substantially C-shaped about the first hole.

3. A printed circuit board comprising a solder pad disposed about and displaced from a hole through the circuit board and solder mask covering a portion of the solder pad such that the unmasked portion of the solder pad is substantially C-shaped 4. A method of assembling a printed circuit board comprising:
   installing electrical components into a laminated multilayered printed circuit board;
   providing a substantially C-shaped solder pad disposed about a first hole through the circuit board with a second plated through-hole through the laminated circuit board at the location of the C-shaped solder pad;
   soldering the electrical components onto the circuit board using a wave-soldering technique whereby the wave of molten solder is in intimate contact with the leads on the electrical components and the C-shaped solder pad.

5. A printed circuit board having a first side and a second side comprising:
   an electrical conductor on the second side of the circuit board;
   a C-shaped solder pad on the first side of the circuit board disposed about a mounting hole through the circuit board; and
   a plated through-hole electrically interconnecting the C-shaped solder pad to the electrical conductor on the second side of the circuit board.

6. A printed circuit board having a first side and a second side comprising:
   a mounting hole through the circuit board;

a C-shaped solder pad on the first side of the circuit board disposed about the mounting hole through the circuit board;

a pad of conductive material on the second side of the circuit board disposed about the mounting hole through the circuit board; and, a plurality of plated through-holes passing through the C-shaped solder pad and electrically interconnecting the C-shaped solder pad to the pad of conductive material on the second side of the circuit board.

7. An electronic assembly comprising:

an electrically conductive chassis;

a printed circuit board comprising a substantially C-shaped solder pad disposed about a hole through the circuit board;

mounting means attaching the printed circuit board to the chassis, said mounting means passing through the hole having a substantially C-shaped solder pad disposed about it and electrically bonding the chassis to the C-shaped solder pad.

* * * * *